United States Patent [19]
Calveley

[11] Patent Number: 6,165,911
[45] Date of Patent: Dec. 26, 2000

[54] METHOD OF PATTERNING A METAL LAYER

[76] Inventor: Peter Braden Calveley, Private Bag, MBE N180 Auckland, New Zealand

[21] Appl. No.: 09/474,420

[22] Filed: Dec. 29, 1999

[51] Int. Cl.[7] .................................................. H01L 21/302
[52] U.S. Cl. .............................. 438/754; 29/874; 29/830; 29/831
[58] Field of Search .............................. 438/754; 29/874, 29/830, 831

[56] References Cited

U.S. PATENT DOCUMENTS

| | | | |
|---|---|---|---|
| 3,573,570 | 4/1971 | Fuller et al. ............................. | 317/235 |
| 5,434,107 | 7/1995 | Paranjpe ................................... | 437/225 |
| 5,509,553 | 4/1996 | Hunter, Jr. et al. ...................... | 216/13 |
| 5,772,905 | 6/1998 | Chou . | |
| 6,032,490 | 3/2000 | Shibata et al. ........................... | 65/169 |

OTHER PUBLICATIONS

Tai–Chin Lo and Miu–Ying Chan "Downsiting bald Wires to Submirron Range: A Self–Planorited Au Metallization Process by Selective Electroplating Fas: LSI Applications" Jasbulge Journal of Applied Physics; vol. 34, 1995, Part 2, No. 78, pp L945–L947, Jul. 15, 1995.

"X–ray lithography atr 100A linewidths using X–ray masks fabricated by shadowing techniques" D.C. Flanders, Journal of Vacuum Science and Technology, 16(6), Nov./Dec. 1979 pp 1615–1619.

"Features of gold having micrometer to centimeter can be formed through a combination of stamping with an elastomeric stamp and on alkanethiel ink followed by chemical etching" Amit Kumar & George M. Whitesides, Applied Physics Letters 63(14), Oct. 4, 1993 pp 2002–2004.

"Fabrication of large arrays of metallic nanowires on v–grooved substrates" J. Jorritsma, M.A.M Gijs, C. Schouenberger, and J.G.H Stienen, Applied Physics Letters 67(10), Sep. 4, 1995 pp 1489–1491.

"Imprint Lithography with 25–Nanometer Resolution" Stephen Y. Chou, Peter R. Krauss, Preston J. Renstrom, Science vol. 272 (Reports) Apr. 5, 1996 pp 85–87.

"Nanoscale replication for scanning probe data storage" B. D. Terris, H. J. Mamin, M.E. Best, J.A. Logan & D. Ruear, Applied Physics Letters 69(27), Dec. 30, 1996, pp 4262–4264.

"Highly ordered nanochannel–array architecture in anodic alumina" Hideki Masuda, Haruki Yamada, Masahiro Satoh, Hidetaka Asoh, Masashi Nahak, & Toshiaki Tamanura, Applied Physics Letters, 71(19), Nov. 10, 1997, p 2740–2772.

"Ordered Metal Nanohole Arrays Made by a two–step replication process from anodic porous alumina" Hideki Masuda and Kensi Fukuda, Science vol. 268, Jun. 9, 1995, p 1466–1468.

"Electrodeposited nanoporous TiO2 Film by a two–step replication process from anodic porous alumina" P. Hoyer & H. Masuda, Journal of Materials Science Letters 15 (1996) pp 1228–1230.

"Small quantum–sited Cds particles assembled to form a regularly nanostructured porous film" Patrick Hoyer, Nobuyoshi Baba & Hideki Masuda, Applied Physics Letters 66(20), May 15, 1995 pp 2701–2702.

(List continued on next page.)

*Primary Examiner*—Matthew Smith
*Assistant Examiner*—Renzo Rocchegiani

[57] ABSTRACT

A metal layer is patterned by compression moulding using a stamp to create a thickness contrast pattern, followed by etching to transfer the thickness contrast pattern into the entire thickness of the metal layer. The stamp is typically patterned using a technique such as electron beam lithography, and the etchant typically etches through the entire metal layer. The method is used to produce structures such as microelectronic circuits.

20 Claims, 4 Drawing Sheets

OTHER PUBLICATIONS

"Microcontact Printing of Palladium Colloids: Mirror–Scale Patterning by Electroless Deposition of Copper" Pirmin C. Hidber, Wolfeang Helbig, Enoch Kim & George M. Whitesides, Langmuir 1996, 12, pp 1375–1380.

"Microcontact printing of Alkonethiols on Silver and its Application in Microfabrication" Younen Xia, Enoch Kim & George M. Whitesides, Journal of the Electrochemical Society, vol. 143, No. 3, Mar. 1996, pp 1070–1079.

"Microindentations in metals" Leonard E. Samuels, Microindentation Techniques in Materials Science and Engineering, ASTM STP 889, P.J.Lau G B R. Lawn, Eds, American Society for Testing and Materials, Philadelphia, USA, 1986, pp 5–25.

"The Relation between Load and Penetration in the Atisymmetric Boussih Esq Problem for a punch of Arbitrary Profile" Ian N. Sneddon, International Journal of Engineering Science, vol. 3, pp 47–57, 1965.

"Device for direct writing and reading–out of information based on the scanning tunneling microscopc" V.K. Adamchuk & A.V. Ermakou, Ultramicroscopy No. 45 pp 1–4, 1992.

"A finite–element study of the penetration of an indenter into Coated Systems" Cal, X, et al (Source Unknown) vol. 40 No. 1–2 pp 232–233, 1990.

"Mechanical Behavior of thin films" Richard P. Vinci & J–ost J. Vlassak, Annual Review of Materials Science, vol. 26, pp 431–462, 1996.

"Analysis of pyramid indentation of pressure–sensitive hard metals and Ceramics" A.E. Giannakopoulos and P.L. LArsson, Mechanics of Materials, vol. 25, No. 11, pp 1–35, Jan.–Feb. 1997.

"Anonglous plastic deformation at surfaces : Non–indentation of gold single crystals" S.G. Corcoran, R.J. Colton, E.T. Lilleodden & W.W. Gerberich, Physical Review B, vol. 55, No. 24 pp R16057–R16050, Jun. 15, 1997–II.

"A selective Etching Solution for use with patterned Self–Assembled Monolayers of Alkonethiolates on gold" Yuenen Xia, Xiao–Mei Zhao, Enoch Kim & George M. Whitesides, Chem. Mater., vol. 17, No. 12, pp 2332–2337, 1995.

"The use of Self–Assembled Monolayers and a Selective Etch to Generate Patterned Gold Features" Amit Kumar, Hans A. Bierbuck, Nicholas L. Abbot & George M. Whitesides, Journal of the American Chemical Society, vol. 114, pp 9189–9191, 1992.

"Direct nano–printing on Al substrate using a SiC mold"S. W. Pang, T. Tamamura, M. Nakao,A. Ozawa, and H. Masuda, Journal of Vacuum Science and Technology B 16(3), May/Jun. 1998, pp. 1145–1149.

"Formation of Fine Pattern"Patent Abstracts of Japan–abstract only, describing Japanese Patent No.10096808A2, Tamamura Toshiaki, Nakao Masashi, Masuda Hideki, and Ozawa Akira, Apr. 14, 1998.

METHOD OF PATTERNING A METAL LAYER

BACKGROUND

1. Field of Invention

This invention relates to methods of creating patterns in a metal layer, and in particular in making patterns on a small scale, which has utility, for example in microelectronics.

2. Description of Prior Art

Patterning a metal layer on a small scale is useful in production of nanodevices and gratings. It has a particular utility in patterning interconnects in integrated circuits. A standard method of making interconnects is as follows:
(a) depositing a layer of metal
(b) depositing a layer of photoresist on the metal layer
(c) selectively exposing the photoresist to ultraviolet light using a masking process
(d) selectively removing the photoresist by etching
(e) selectively etching to remove portions of the metal layer exposed by the removal of the photoresist.

It will be appreciated that this is a complex process involving many processing steps, and that sophisticated optical equipment is required to selectively expose the photoresist at high resolution.

In order to achieve patterns at a small scale without radiation lithography, imprint lithography has been recently investigated, in which surfaces are modified by contact with a master pattern, which either moulds surfaces directly, or initiates chemical changes on a surface. However, none of these processes create a discontinuous metallic pattern without a large number of intermediate steps.

A use for an array of holes in a thin metal film, if the substrate is then dissolved away, is as a membrane for microfiltration or a mask for fabrication of nanodot arrays by evaporation.

Gold is also an important material in electronics based on electron spin.

In order to provide background information so that the invention may be completely understood and appreciated in its proper context, reference will be made to a number of prior art publications as follows:

[1] "X-ray lithography at ~100 A linewidths using x-ray masks fabricated by shadowing techniques" D. C. Flanders, Journal of Vacuum Science and Technology, 16(6), November/December 1979 pp 1615–1619.

[2] "Features of gold having micrometer to centimeter dimensions can be formed through a combination of stamping with an elastomeric stamp and an alkanethiol "ink" followed by chemical etching", Amit Kumar and George M. Whitesides, Applied Physics Letters 63(14), Oct. 4, 1993 pp 2002–2004.

[3] "Fabrication of large arrays of metallic nanowires on V-grooved substrates" J. Jorritsma, M. A. M. Gijs, C. Schonenberger, and J. G. H. Stienen, Applied Physics Letters 67 (10), Sep, 4, 1995 pp 1489–1491.

[4] "Imprint Lithography with 25-Nanometer Resolution" Stephen Y. Chou, Peter R. Krauss, Preston J. Renstrom, Science Vol. 272 (Reports) Apr. 5, 1996 pp 85–87.

[5] "Nanoscale replication for scanning probe data storage" B. D. Terris, H. J. Mamin, M. E. Best, J. A. Logan and D. Rugar, Applied Physics Letters 69(27) Dec. 30, 1996 pp 4262–4264.

[6] "Highly ordered nanochannel-array architecture in anodic alumina" Hideki Masuda, Haruki Yamada, Masahiro Satoh, Hidetaka Asoh, Masashi Nakao, and Toshiaki Tamamura, Applied Physics Letters, 71 (19), Nov. 10, 1997, pp 2770–2772.

[7] "Ordered Metal Nanohole Arrays Made by a Two-Step Replication of Honeycomb Structures of Anodic Alumina" Hideki Masuda and Kenji Fukuda, Science, Vol 268, Jun. 9, 1995, pp 1466–141468.

[8] "Electrodeposited nanoporous TiO2 film by a two-step replication process from anodic porous alumina" P. Hoyer and H. Masuda, Journal of Materials Science Letters 15 (1996) pp 1228–1230.

[9] "Small quantum-sized CdS particles assembled to form a regularly nanostructured porous film" Patrick Hoyer, Nobuyoshi Baba and Hideki Masuda, Applied Physics Letters 66 (20), May 15, 1995.

[10] "Microcontact Printing of Palladium Colloids: Micron-Scale Patterning by Electroless Deposition of Copper", Pirmin C. Hidber, Wolfgang Helbig, Enoch Kim, and George M. Whitesides, Langmuir 1996, 12, pp 1375–1380.

[11] "Microcontact printing of Alkanethiols on Silver and Its Application in Microfabrication", Younan Xia, Enoch Kim, and George M. Whitesides, Journal of the Electrochemical Society, Volume 143, No. 3, March 1996, pp 1070–1079.

[12] "Microindentations in Metals", Leonard E. Samuels, Microindentation Techniques in Materials Science and Engineering, ASTM STP 889, P. J. lau and B. R. Lawn, Eds, American Society for Testing and Materials, Philadelphia, 1986, pp 5–25.

[13] "The Relation Between Load and Penetration in the Axisymmetric Boussinesq Problem For a Punch of Arbitrary Profile" Ian N. Sneddon, International Journal of Engineering Science, Volume 3, pp 47–57, 1965.

[14] "Device for direct writing and reading-out of information based on the scanning tunneling microscope", V. K. Adamchuk and A. V. Ermakov, Ultramicroscopy no. 45 pp 1–4, 1992.

[15] "A finite-element study of the penetration of an indenter into coated systems" Cal, X, et al, Volume 40 no. 1–2 pp 232–233, 1990.

[16] "Mechanical Behavior of thin films", Richard P. Vinci and Joost J. Vlassak, Annual review of Materials Science, Vol. 26, pp 431–462, 1996.

[17] "Analysis of pyramid indentation, of pressure-sensitive hard metals and ceramics", A. E. Giannakopoulos and P. L. Larsson, Mechanics of Materials, vol. 25, no. 11 pp 1–35, January–February 1997.

[18] "Anomalous plastic deformation at surfaces: Nanoindentation of gold single crystals", S. G. Corcoran, R. J. Colton, E. T. Lilleodden, and W. W. Gerberich, Physical Review B, Volume 55, Number 24, pp R16057–R16060, Jun. 15, 1997-II.

[19] "A Selective Etching Solution for Use with Patterned Self-Assembled Monolayers of Alkanethiolates on Gold", Younan Xia, Xiao-Mei Zhao, Enoch Kim and George M. Whitesides., Chem. Mater., Volume 7, Number 12, pp 2332–2337, 1995.

[20] "The Use of Self-Assembled Monolayers and a Selective Etch to Generate Patterned Gold Features", Amit Kumar, Hans A. Bierbuyck, Nicholas L. Abbot, and George M. Whitesides, Journal of the American Chemical Society, Volume 114, pp 9189–9191, 1992.

[1] describes production of short-period gratings. In this method, triangular cross-section surface relief structures are fabricated in silicon by anisotropic chemical etching, or square cross-section surface relief structures with smooth vertical sidewalls and sharp corners are fabricated in silicon dioxide by reactive-ion-etching in CHF3 gas. The structures are then transferred to a polyimide membrane by moulding.

The surface features on the silicon or SiO2 are covered with liquid polyimide plastic, which is then polymerised by heating, and removed by peeling after immersion in dilute hydrofluoric acid, or the silicon may be etched away by acid to leave the polyimide with a surface relief structure.

The polyimide surface then has a metal such as tungsten deposited on it at an oblique angle to create a periodic metallic structure on the polyimide surface.

A disadvantage of this method is that it is time-consuming, as heating of the polyimide is required to polymerise it. A further disadvantage is that, in one variant, a time-consuming immersion step is required to separate the mould from the polyimide. In another variant, the mould must be dissolved to separate it from the polyimide, and this renders mass-production difficult, as new moulds must be fabricated for every new grating. A further disadvantage is that a polyimide surface must be fabricated prior to patterning the metal surface.

[2] describes a method of fabricating patterns of gold, on silicon substrates. A stamp was manufactured in one of two ways:

(i) A pattern was photographed, and the positive side used as a mask. An ultraviolet light was projected through the slide onto a phenolformaldehyde polymer, and then exposed regions of the polymer were dissolved in a mild soap solution. This method produced features as small as 200 micrometers.

(ii) A master template, such as a transmission electron microscopy grid, was covered with a mixture of polydimethylsiloxane (PDMS) and curing agent, and allowed to cure. The PDMS was then peeled off the master template to form the stamp. This method produced features as small as 1 micrometer.

The stamp was then used to stamp alkatheniol ink onto a gold layer on a substrate, and the gold was then etched in a basic cyanide ion/dioxygen aqueous solution, to replicate the pattern.

Furthermore, the method allowed stamping the same pattern twice with the same stamp; the stamp was rotated through an angle, to produce a pattern on the substrate which was periodic in 2 dimensions.

One problem with this method was that some features became blurred due to the inefficient method of delivering the thiol to the surface of the substrate. Another problem was that the stamp must be re-inked. Another problem was that the substrate was relatively complex.

[3] describes the fabrication of wires on a V-grooved substrate. The V-grooved substrate is patterned using holographic laser interferometry and anisotropic etching, with a period of 200 nm. Then the substrate is coated with a thin gold film of about 30 nm thickness. Then the substrate is spin coated with very low viscosity diluted photoresist. Next, the photoresist is etched in an oxygen plasma, which removes the photoresist on the tops of the grooves. The exposed gold is then etched in a KCN-based solution, resulting in wires of a width down to 50 nm. The photoresist is then removed in acetone. A disadvantage of this method is that it has a large number of steps.

[4] describes a method of patterning surfaces with 25 nm resolution. A silicon dioxide mould was patterned by electron beam lithography, and the patterns were etched into the silicon dioxide by fluorine-based reactive-ion-etching. The mould was then pressed into a thin PMMA resist on a silicon wafer to create a thickness contrast pattern in the PMMA. The mould was held in place and the PMMA was cooled below the PMMA glass transition temperature.

Then the mould was removed, and oxygen reactive-ion-etching was used to anisotropically remove the thinner resist areas, thereby transferring the thickness contrast pattern into the entire resist thickness. It also describes lift-off processes which may be used to fabricate metal structures once a thickness contrast pattern has been created in the PMMA. A difficulty with this process is that the metal fabrication process involves preliminary steps involving patterning PMMA. Therefore, this reference teaches away from the method of the current invention.

[5] describes the writing of features on a master by electron beam lithography. The pattern is then used to stamp replicas in an acrylate-based photopolymer, which is cured by exposing it to UV light for 2 minutes, after which the master is separated from the polymer. The polymer is further hardened by baking in a nitrogen atmosphere at 180 degrees Centigrade for 1.5 hours.

Alternatively, the master was produced by thermomechanical viriting using an atomic force microscope tip. A disadvantage of this method is that it does not lead to the production of a discontinuous metal pattern.

[6] describes the production of highly ordered nanochannel-array architecture in anodic alumina. In this process, a master pattern of silicon carbide was placed on an electrochemically polished, annealed aluminium sheet, and pressed using an oil press at room temperature, with a pressure of approximately 5 tons per square centimeter, to transfer the pattern to the aluminium sheet.

Then the aluminium sheet was anodised in an oxalic acid solution under constant voltage, to create an array of nanochannels.

The specimen was then dipped in an acid solution to widen the pores, the Al layer was removed in a saturated HgCl2 solution, and then the barrier layer was removed by etching in phosphoric acid.

It was suggested that this method would find utility in mass production of restrictedly ordered nanochannel array architectures with a high aspect ratio, for example to create long-range periodicity in the fabrication of huge data storage systems in which the long-range ordering was essential for tracking in read and write operations.

A disadvantage of this method was that only periodic structures were made.

Another disadvantage of this method is that it does not readily lend itself to the production of a discontinuous metal pattern on a substrate coated with a discontinuous insulator pattern, as is useful in making interconnects in integrated circuits.

This is because the anodisation is strongly dependent on the electric field direction, which is difficult keep uniform in such a configuration.

Another disadvantage of the above method is the large number of steps in the process.

Another disadvantage is the need for a voltage source to anodise the aluminium.

[7] describes a process in which the honeycomb structure of porous anodic alumina was coated with metal by vacuum deposition. Then PMMA was injected into the holes in the structure and polymerized. The alumina was then removed using sodium hydroxide, and then platinum or gold was deposited on the PMMA by electroless deposition, the metal coating acting as a catalyst. The PMMA was then dissolved in acetone to leave a replica of the original alumina structure in the platinum or gold. A disadvantage of this method was that the patterns which can be created using the surface of porous anodic alumina are limited in use. Another disadvantage was the large number of steps in the process.

In [8], the honeycomb structure of porous anodic alumina was coated with metal by vacuum deposition. Then PMMA was injected into the holes in the structure and polymerized. The alumina was then removed using sodium hydroxide, and then titanium dioxide was deposited on the PMMA by electrodeposition, the metal coating acting as an electrode. The PMMA was then dissolved in acetone to leave a replica of the original alumina structure in the platinum. A disadvantage of this method was that the patterns which can be created using the surface of porous anodic alumina are limited in use. Another disadvantage was the large number of steps in the process.

[9] describes the replication of alumina by a process similar to that described in [8], except that the electrodeposited material was cadmium sulphide. It suffers from the same disadvantages as [7] and [8].

[10] describes a method for forming copper patterns on surfaces. A substrate of silicon with a native oxide layer, glass, or a polymer, was cleaned, oxidised (for the polymer) to form surface hydroxyl groups, and then immersed in a solution of organosilanes in ethanol or heptane, to ensure a strong interaction between the catalyst and the underlying substrate. A patterned elastomeric stamp was fabricated from poly(dimethylsiloxane), and used to selectively deposit palladium colloids stabilised with tetraalkylammonium bromides to the substrate surface. The palladium colloids act as a catalyst for the selective electroless deposition of copper onto the substrate surface. A disadvantage of this method is that the step of "inking" the elastomeric stamp is complicated and time-consuming, as the stamp must be immersed in the colloidal solution for 2s, and dried under a stream of nitrogen, with the procedure being repeated 2 or 3 times.

[11] describes the creation of features in silver and gold by printing of patterns of self-assembled monolayers of alkanethiols onto the metal surface. The self-assembled monolayers act as a nanometer-thin resist which protects the underlying metal surface from etchants.

Therefore, the pattern is selectively etched into the metal. [11] and the references therein list a number of chemical solutions suitable for selectively etching gold and silver, and procedures for the use of these etchants. In particular, ferri/ferrocyanide solutions, dioxygen/potassium cyanide solutions, ferric nitrate solutions, and hydrogen peroxide solutions were examined.

[11] also examined the uses of patterned films of silver as secondary masks for the etching of silicon and silicon dioxide substrates, and as moulds for casting PDMS stamps, to generate further negative patterns. [11] suffers from the same disadvantages as outlined for [10] relating to re-inking the stamp.

[12] provides a useful reference for those skilled in the art which reviews the mechanisms involved in microindentation of metals, with a primary emphasis on the use of indentation for hardness testing.

[13] is a useful reference for those skilled in the art, providing a mathematical method for modelling indentations in materials by indenters of arbitrary shape, with particular emphasis on a flat-ended cylindrical punch, a punch in the form of a paraboloid of revolution, a spherical punch, and a punch in the shape of an ellipsoid of revolution.

[14] describes the creation of indentations of approximately 10 nm depth and 50 nm across in gold, using a scanning tunnelling microscope tip with an impact velocity of 0.0003 meters per second, in a time of 100 microseconds. Indentations of 20–30 nm diameter and 10 nm depth were found to be more stable, not merging when spaced closer than 40 nm.

[15] describes numerical modelling and experimental testing of indentation into coated systems, including gold and silver.

[16] describes research on the mechanical properties of thin films and the differences between the behaviour of bulk materials and thin films of the same materials. Nanoinentation of thin films is reviewed, and low-temperature and high-temperature plastic flow in thin films is described. In particular, the reduction in strength of thin metal films when heated, and in particular, of Cu films when heated above 400 degrees centigrade, and of Al when heated above 450 degrees centigrade, is of interest to those skilled in the art.

[17] presents a mathematical model and experimental results for indenters of various geometries.

[18] describes nanoindentation data and modelling of nucleation and multiplication of dislocations of gold. This allows prediction of the shapes of nanoscale patterns formed by indentation.

[19] details an etchant for use with gold, copper and silver based on a ferricyanide oxidant and thiosulphate co-ordinating ligand, which achieves rapid, low-defect etching in a lower-risk environment than cyanide ion/dioxygen etching solutions. [19] also investigates etching rates.

[20] describes etching of gold by a cyanide ion/dioxygen etching solutions.

Whatever the precise merits, features and advantages of the above cited references, none of them achieves or fulfils the purposes of the method of the present invention.

OBJECTS AND ADVANTAGES

Accordingly, several objects and advantages of my invention are:
(a) To provide a method of patterning a metal surface which requires a smaller number of processing steps.
(b) To provide a method of patterning a metal surface which does not require radiation exposure.

Further objects and advantages of my invention will become apparent from a consideration of the drawings and ensuing description.

The invention is not limited to the specific items in the drawings, and the drawings and text are illustrative only of the principles involved. The actual scope of the invention will be covered by the claims.

DRAWING FIGURES

The invention is described in greater detail hereinafter relative to non-limitative embodiments and the attached drawings, wherein show:

Figure 4:
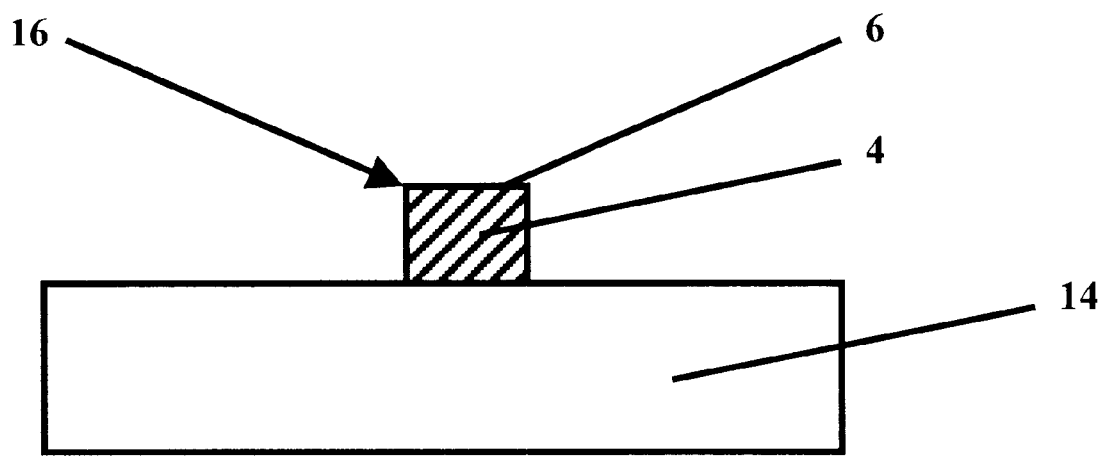

FIG. 4, which shows a sectional view of a metal layer, mounted on a substrate, with a thickness contrast pattern transferred into the entire thickness of a metal layer by etching.

REFERENCE NUMERALS IN DRAWINGS 4 metal layer
6 metal surface
8 stamp
10 indentation 12 stamping surface defining a first pattern
14 substrate
16 thickness contrast pattern

SUMMARY OF THE INVENTION

A metal layer is patterned by compression moulding using a stamp to create a thickness contrast pattern, followed by etching to transfer the thickness contrast pattern into the entire thickness of the metal layer.

DETAILED DESCRIPTION

Figure 1:
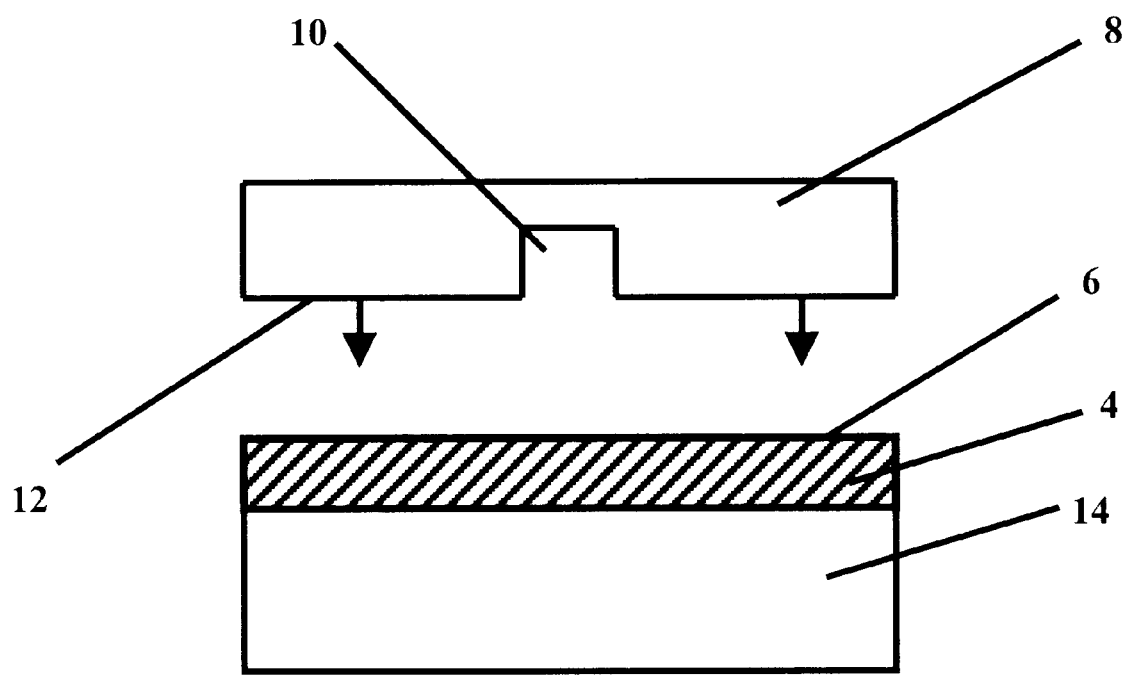
FIG. 1 is a sectional view of a stamp with an indentation on its stamping surface defining a pattern, moving towards a metal surface of a metal layer, mounted on a substrate.

Refer now to FIG. 1, which is a sectional view of stamp 8 with indentation 10 on its stamping surface 12 defining a pattern moving towards metal surface 6 of metal layer 4, mounted on substrate 14.

Metal layer 4 may be deposited on substrate 14 by conventional means known to those skilled in the art, such as sputtering, molecular beam epitaxy, electroless plating, and may be subjected to processes such as electrochemical polishing. Although many different metals may be used in metal layer 4, ones which would find particular utility in microelectronics would include gold, silver, copper, aluminium, platinum, indium, tungsten, and any of the metals and alloys which are known to exhibit superconductivity. In principle, any crystalline solid having a crystalline solid surface may be used in place of a metal in metal layer, for example a semiconductor such as silicon, gallium arsenide, or gallium aluminium arsenide, or an insulator such as silicon dioxide.

Gold, in particular has been shown to exhibit very plastic behaviour in microindentation studies. In particular, gold is suited to application of this technique because of its highly plastic behaviour under indentation loads. Gold has been widely used in GaAs and silicon ICs due to its high conductivity, and its superior electromigration characteristics may lend it to application in high-speed Si LSI applications.

Annealing may be used to facilitate deformation in the moulding process.

Stamp 8 is typically made from a material which has a low thermal expansion coefficient, and is liable to resist distortion during repeated stampings. Stamping surface 12 is typically made from a very hard material, such as tungsten carbide, tungsten nitride, boron nitride, boron carbide, silicon nitride, silicon carbide, or diamond.

The patterning, such as indentation 10, may be created by conventional high-resolution lithographic methods, such as ultraviolet or x-ray lithography, electron or ion beam lithography, or scanning probe lithography, or may be formed by the stepped vicinal surface of a crystal. A thin layer of another material (not shown) may also be deposited on 12 stamping surface 12 defining a first pattern for example as a release layer, such as an amorphous TbFeCo alloy.

Figure 2:
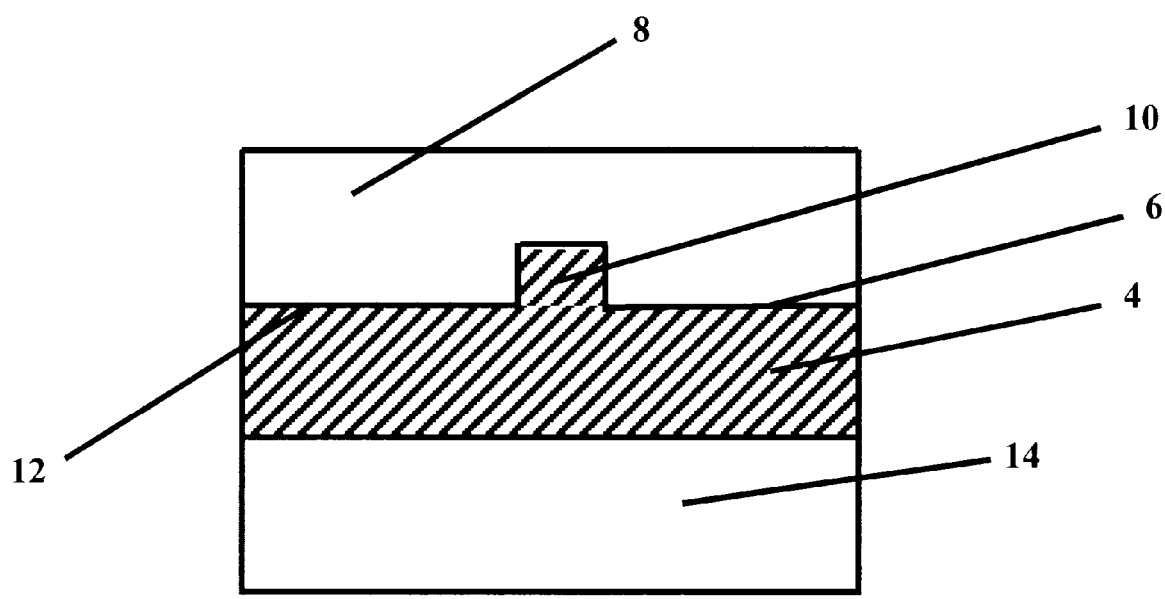
FIG. 2 shows a sectional view of a stamp with an indentation on its stamping surface defining a pattern positioned in contact with a metal surface, and thereby compression moulding a metal layer.

Refer now to FIG. 2, which shows a sectional view of stamp 8 with indentation 10 on its stamping surface 12 defining a pattern positioned in contact with metal surface 6, and thereby compression moulding metal layer 4.

The pressure with which stamp 8 is applied to metal surface 6, will depend on the malleability of metal layer 4, and the depth of thickness contrast pattern 16 required. However, the pressure may typically be of the order of tonnes per square centimeter for aluminium.

Figure 3:
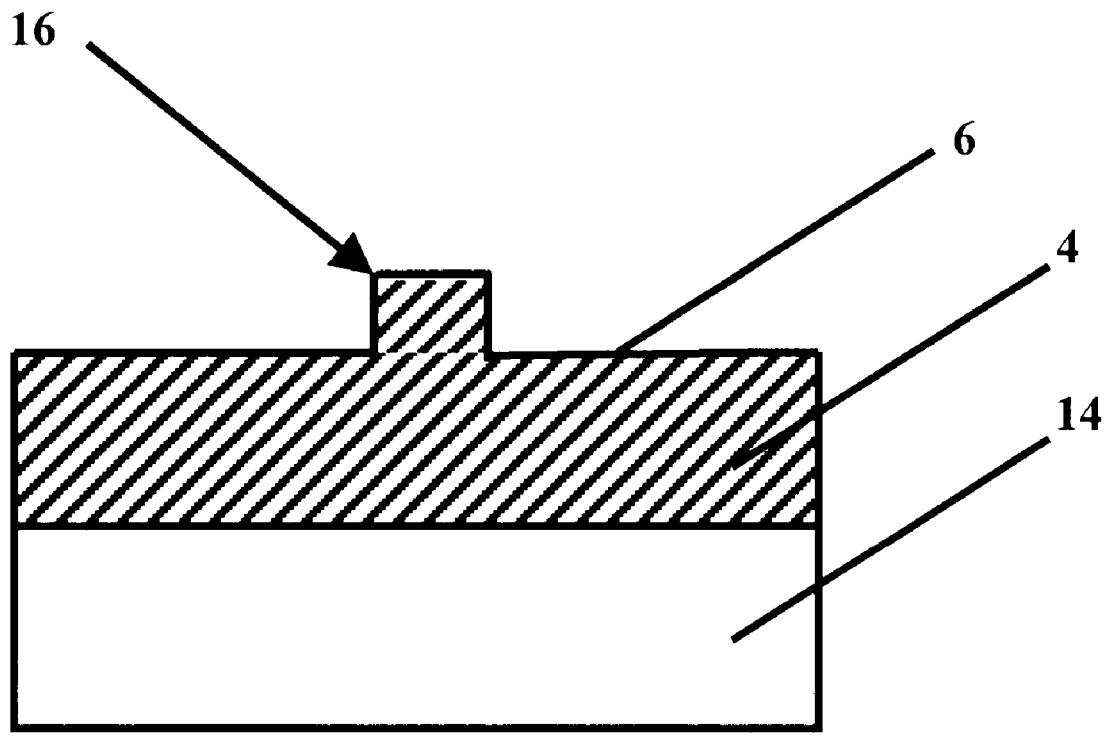
FIG. 3 shows a sectional view of a metal surface of a metal layer, mounted on a substrate, with a thickness contrast pattern compression moulded into a metal layer.

Refer now to FIG. 3, which shows a sectional view of metal surface 6 of metal layer 4, mounted on substrate 14, with thickness contrast pattern 16 compression moulded in metal layer 4.

Stamp 8 is removed from metal surface 6, to provide a thickness contrast pattern in layer 4, and is typically reused. If desired, multiple stampings may be made on the same metal surface 6, and either metal surface 6 and/or stamp 8 may be curved, with stamping taking place with a rolling motion.

Refer now to FIG. 4, which shows a sectional view of metal layer 4, mounted on substrate 14, with thickness contrast pattern 16 transferred into the entire thickness of metal layer 4 by etching. Metal surface 6 is etched to remove material from metal layer 4 and thereby transfer thickness contrast pattern 16 into the entire thickness of metal layer 4.

The etchant used will depend on the particular metal used in metal layer 4, but may, for example, include a HgCl2 solution for aluminium, solutions based upon oxidants such as ferri/ferrocyanide, dioxygen, ferric nitrate or hydrogen peroxide, with appropriate co-ordinating ligands known to those skilled in the art, for gold or silver, or any of a number of appropriate acidic solutions or gases known to those skilled in the art. Reactive ion-beam etching may also be used. Thus the reader will see that the method of the invention provides an economical way of patterning a metal layer.

After stamp 8 has been applied to metal surface 6, in a planar embodiment of this invention, metal surface 6 may typically be described by an equation of the form $(x,y,z) = (x,y,f(x,y))(1)$, where x and y are the Cartesian co-ordinates of the plane initially parallel to metal surface 6, and $f(x,y)$ may be predicted from experimental data as well as by mathematical analyses of the types described in references [12–17].

The etching step for an anisotropic etchant may be decribed by considering the removal of a layer from metal surface 6, giving a final shape to metal surface 6 of $(x,y,z) = r\tau(x-a, y-b, f(x,y)-c)(2)$, where r is the etching rate of the etchant in meters per second, $\tau$ is the etching time, and a,b, and c are, respectively, the x,y, and z components of the unit normal vector $$r = \frac{1}{|grad(f(x, y) - z)|} grad(f(x, y) - z) \quad (3)$$

to the surface described by $f(x,y)$.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A method of patterning a substantially crystalline solid layer having a substantially crystalline solid surface, comprising the steps of:

(a) providing a stamp having a stamping surface defining a first pattern;

(b) positioning at least one of said stamping surface and said substantially crystalline solid surface in a first orientation wherein at least a portion of said stamping surface contacts at least a portion of said substantially crystalline solid surface, thereby to compression mould a moulded substantially crystalline solid surface defining a thickness contrast pattern in said substantially crystalline solid layer and;

(c) effecting relative movement between said stamping surface and said substantially crystalline solid surface wherein said portion of said stamping surface contacting said portion of said substantially crystalline solid surface, is removed from said portion of said substantially crystalline solid surface, to provide a moulded substantially crystalline solid surface defining a thickness contrast pattern in said substantially crystalline solid layer; and (d) etching through said substantially crystalline solid layer at said moulded substantially crystalline solid surface to remove material from said substantially crystalline solid layer and thereby transfer said thickness contrast pattern into the entire thickness of said substantially crystalline solid layer.

2. The method of claim 1 wherein said etching step comprises exposing said substantially crystalline solid layer to an acidic solution.

3. The method of claim 1 wherein said etching step comprises reactive ion-beam etching.

4. The method of claim 1 wherein said stamping surface comprises a substantially hard material.

5. The method of claim 4 wherein said substantially hard material is composed of a substance selected from the following group:

tungsten carbide, tungsten nitride, boron nitride, boron carbide, silicon nitride, silicon carbide, and diamond.

6. The method of claim 1 wherein said substantially crystalline solid layer further comprises a semiconductor.

7. The method of claim 6 wherein said semiconductor is composed of a material selected from the following group:

silicon, gallium arsenide, or gallium aluminium arsenide.

8. The method of claim 1 wherein said substantially crystalline solid layer further comprises an insulator.

9. The method of claim 8 wherein said insulator comprises silicon dioxide.

10. The method of claim 1 wherein said stamping surface including at least one indentation, said indentation being contiguous with said stamping surface defining said first pattern.

11. A method of patterning a metal layer having a metal surface, comprising the steps of:

(a) providing a stamp having a stamping surface defining a first pattern;

(b) positioning at least one of said stamping surface and said metal surface in a first orientation wherein at least a portion of said stamping surface contacts at least a portion of said metal surface, thereby to compression mould a moulded metal surface defining a thickness contrast pattern in said metal layer and;

(c) effecting relative movement between said stamping surface and said metal surface wherein said portion of said stamping surface contacting said portion of said metal surface, is removed from said portion of said metal surface, to provide a moulded metal surface defining a thickness contrast pattern in said metal layer; and (d) etching through said metal layer at said moulded metal surface to remove material from said metal layer and thereby transfer said thickness contrast pattern into the entire thickness of said metal layer.

12. The method of claim 11 wherein said etching step comprises exposing said metal layer to an acidic solution.

13. The method of claim 11 wherein said metal layer is annealed.

14. The method of claim 11 wherein said metal layer having said metal surface is composed of a metal selected from the following group:

gold, silver, copper, aluminium, platinum, indium, and tungsten.

15. The method of claim 11 wherein said etching step comprises exposing said metal layer to a solution comprising an oxidant composed of a chemical selected from the following group:

ferricyanide, ferrocyanide, dioxygen, ferric nitrate, and hydrogen peroxide.

16. The method of claim 11 wherein said etching step comprises:

reactive ion-beam etching.

17. The method of claim 11 wherein said stamping surface comprises a substantially hard material.

18. The method of claim 17 wherein said substantially hard material is composed of a substance selected from the following group:

tungsten carbide, tungsten nitride, boron nitride, boron carbide, silicon nitride, silicon carbide, and diamond.

19. The method of claim 11 wherein said stamping surface including at least one indentation, said indentation being contiguous with said stamping surface defining said first pattern.

20. The method of claim 11 wherein said metal layer having said metal surface comprises a superconductor.

* * * * *